(12) United States Patent
Kretchmer et al.

(10) Patent No.: US 7,365,413 B1
(45) Date of Patent: Apr. 29, 2008

(54) REDUCED POWER DISTRIBUTION MESH RESISTANCE USING A MODIFIED SWISS-CHEESE SLOTTING PATTERN

(75) Inventors: Yaron Kretchmer, Fremont, CA (US); Fredrik Haghverdian, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 480 days.

(21) Appl. No.: 10/940,511

(22) Filed: Sep. 13, 2004

(51) Int. Cl.
*H01L 29/06* (2006.01)
(52) U.S. Cl. .................. 257/618; 257/621; 257/622; 257/773; 257/774; 257/776; 257/797; 257/E29.26; 257/E21.553; 257/E21.555; 257/E21.577
(58) Field of Classification Search ............... 257/520, 257/559, 618–622, 773–776, 797, E29.201, 257/E29.26, E21.553–E21.577; 438/427, 438/462, 589, 637–640, 666, 674, 675
See application file for complete search history.

(56) References Cited

U.S. PATENT DOCUMENTS

| | | | | |
|---|---|---|---|---|
| 5,200,807 A | * | 4/1993 | Eguchi | ................... 257/758 |
| 5,357,399 A | * | 10/1994 | Salisbury | ................ 361/529 |
| 6,621,167 B1 | | 9/2003 | Lin et al. | |
| 7,138,722 B2 | * | 11/2006 | Miyamoto et al. | ......... 257/777 |

* cited by examiner

*Primary Examiner*—Jasmine Clark
(74) *Attorney, Agent, or Firm*—Weaver Austin Villeneuve & Sampson LLP

(57) ABSTRACT

Electrical interconnects with a slotting pattern are provided in the present invention. In addition, the masks for making such interconnects and semiconductor devices incorporating such interconnects are also provided in the present invention. The slotting pattern may be designed to minimize dishing effects of the interconnects as a result of planarization. Further, the slotting pattern may be designed to minimize resistance in the interconnects. For instance, the slotting pattern may include slots that are staggered, evenly aligned, or a combination of both staggered and evenly aligned. In addition, the slots may be spaced apart such that electrical paths are shorter across the interconnects. By incorporating such interconnects in semiconductor devices, better performing semiconductor devices can be realized.

32 Claims, 5 Drawing Sheets

REDUCED POWER DISTRIBUTION MESH RESISTANCE USING A MODIFIED SWISS-CHEESE SLOTTING PATTERN

BACKGROUND OF THE INVENTION

The present invention relates generally to semiconductors. More particularly, the invention relates to electrical interconnects, masks for making such interconnects, and semiconductor devices incorporating such interconnects.

In manufacturing semiconductor devices, various components are formed on a silicon substrate and electrically connected together with interconnects. For instance, after a component such as a transistor has been fabricated, interconnects are used to connect it with another component. This connection process is commonly known as "metallization", which may incorporate various photolighographic and deposition techniques.

In general, interconnects are solid metal pieces that span across a dielectric layer. In addition, interconnects may be solid metal vias that span between dielectric layers. In forming some interconnects, planarization is typically performed on both the dielectric layers and the interconnects. Planarization may include using a chemical-mechanical polishing (CMP) process. In some cases, especially when wider interconnects are used for power buses/rails, the interconnects are more susceptible to higher degrees of dishing effects during planarization. That is, surface portions of the interconnects may end up with substantially different heights relative to the surfaces of their surrounding dielectric layers, thereby resulting with different thicknesses and potentially increased resistances. Such non-uniformity of interconnects within the semiconductor often leads to integration and manufacturing problems, which in turn can lead to various performance problems (e.g., increased time delays, less robust connectivity, etc.).

Accordingly, it would be beneficial to be able to form interconnects that can be integrated into semiconductor devices so that their performances are improved.

SUMMARY OF THE INVENTION

To achieve the foregoing, electrical interconnects with slotting patterns, masks for making such interconnects, and semiconductor devices incorporating such interconnects are provided in the present invention. A slotting pattern is configured such that dishing effects, electrical path resistances, and/or time delays are minimized for an interconnect.

In general, evenly distributed slots are arranged in linear alignments and separated by linear metal regions on the interconnect. The linear alignments are substantially parallel with a long axis of the interconnect. Accordingly, the shortest possible electrical paths may be provided across the interconnect in the direction of current flow. As such, efficient interconnects and semiconductor devices can be realized.

These and other features and advantages of the present invention will be presented in more detail in the following specification of the invention and the accompanying figures, which illustrate by way of example the principles of the invention.

BRIEF DESCRIPTION OF THE DRAWINGS

FIG. 1 illustrates a cross-sectional view of a portion of a semiconductor device for which the present invention can be applied to.

DETAILED DESCRIPTION OF THE PREFERRED EMBODIMENTS

Figure 1:
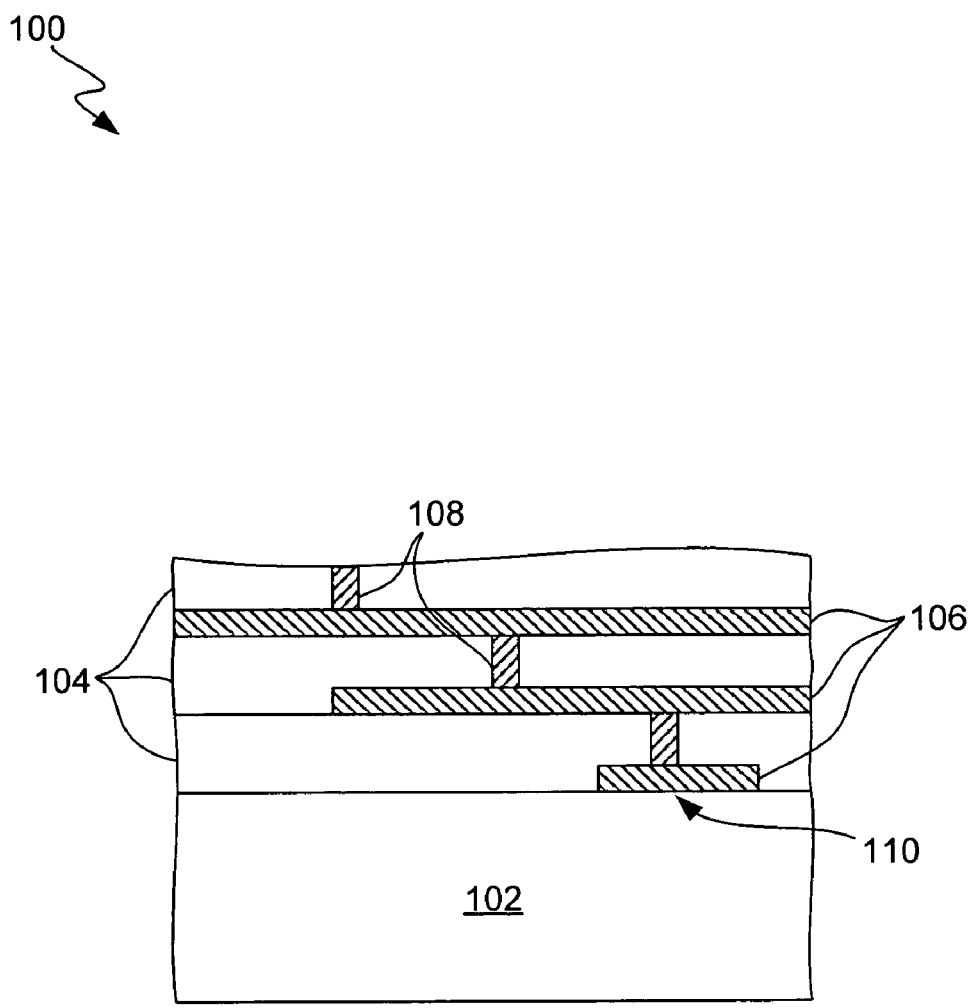

Reference will now be made in detail to preferred embodiments of the present invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Electrical interconnects with a slotting pattern are provided in the present invention. In addition, the masks for making such interconnects and semiconductor devices incorporating such interconnects are also provided in the present invention. The slotting pattern may be designed to minimize dishing effects of the interconnects as a result of planarization. Further, the slotting pattern may be designed to minimize resistance in the interconnects. For instance, the slot pattern may include slots that are staggered, evenly aligned, or a combination of both staggered and evenly aligned. In addition, the slots may be spaced apart such that electrical paths are shorter across the interconnects. By incorporating such interconnects in semiconductor devices, better performing semiconductor devices can be realized.

In general, semiconductor devices include multiple dielectric layers with interconnects formed therein. Interconnects within a dielectric layer are formed with trenches that are filled with an electrically conductive material, such as copper. Interconnects between dielectric layers are formed with vias that are also filled with an electrically conductive material. Any excess conductive material in the trenches and vias can then be removed by a planarization process. As mentioned earlier, one example of a planarization process includes using a CMP process.

Common etching and/or masking techniques can be used to create the trenches and vias. As will be discussed below, some of these techniques may further define patterns or features for these interconnects as well as the interconnects themselves.

Besides removing excess conductive material, the planarization process attempts to produce a coplanar surface between the interconnects and surrounding dielectric layer. However, this is seldom the case when solid continuous pieces of metal interconnects are formed. Instead, after the planarization process has been performed, variances in height between the top surfaces of the interconnects and surrounding dielectric layer often result in a phenomenon commonly known as dishing. The degree of dishing tends to be larger for particularly large continuous regions on the interconnects. Dishing can substantially cause non-uniformity of the interconnects in producing higher resistance interconnects and semiconductor devices with poor performance. The dishing effects are particularly greater on interconnects that serve as power rails/buses in the semiconductor device since they are often wider in dimension, thereby exposing larger continuous regions.

Accordingly, one aspect of the present invention is to minimize the effects of dishing by introducing slots into the interconnects. Although slots may reduce the resistances introduced by dishing, they may also increase the resistances introduced by discontinuities in the interconnects. That is, slots may increase the lengths of electrical paths in the direction of the current flow. Therefore, another aspect of the present invention is to arrange the slots in a pattern that can shorten the electrical paths available across the interconnect in the direction of the current flow. As such, signals/currents traveling along these electrical paths can encounter less resistance, thus minimizing the time delays and improving the performance of the interconnects as well as the semiconductor devices that incorporate them.

To further elaborate, FIG. 1 illustrates a cross-sectional view of a portion of a semiconductor device 100 in which the present invention can be applied. As shown, multiple interconnects (e.g., 106 in trenches; 108 in vias) are formed successively in multiple dielectric layers 104 on top of an electrical component 102. Each interconnect may be formed using any number of techniques known to persons skilled in the art. For example, techniques such as sputtering and electroplating may be used. In addition, each interconnect may be formed using any electrically conductive material. For example, the interconnects can include copper, titanium, titanium nitride, tantalum nitride, tungsten, tungsten silicide, aluminum, or any combination of these metals.

Similarly, dielectric layers 104 may be formed using any number of techniques with any type of dielectric material known to persons skilled in the art. For instance, various chemical vapor deposition (CVD) or spin on coating techniques may be used. On the other hand, the dielectric layers 104 may include silicon oxide or boro-phosohosilicate glass (BPSG). The techniques and materials selected may depend on the specific application.

Various interconnect portions are electrically connected together in forming various integrated circuits. One portion is shown electrically connected to electrical component 102, such as a transistor, at surface 110. Surface 110 typically corresponds to an active region of electrical component 102. Generally, interconnects electrically connect various electrical components 102 together. Electrical component 102 is generally formed on a silicon substrate. According to one embodiment, semiconductor device 100 is formed on a portion of a silicon wafer where multiple semiconductor devices are similarly formed together.

Figure 2:
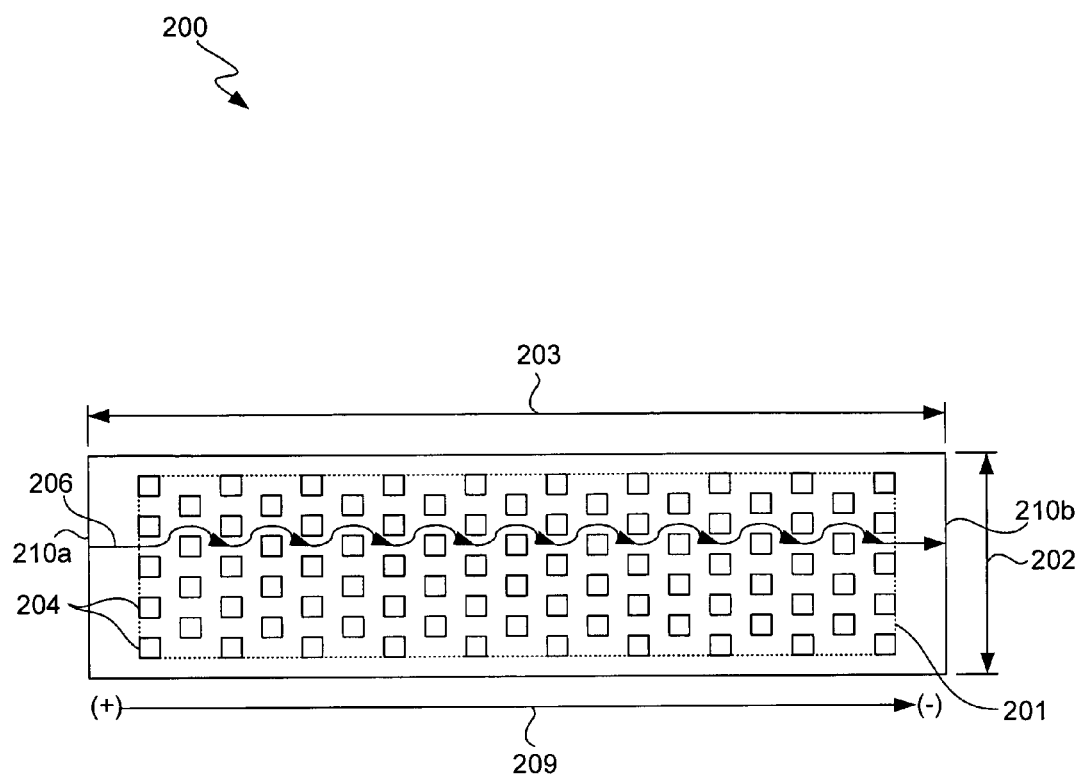
FIG. 2 illustrates a top view of an interconnect portion having a slotting pattern.

Referring to FIG. 2, reduction of dishing and increase of performance in accordance to the present invention are addressed. FIG. 2 illustrates a top view of an interconnect portion 200 having a slotting pattern 201. Interconnect portion 200 typically has a corresponding width 202 (e.g., short axis), length 203 (e.g., long axis), and thickness (not shown). Interconnect portion 200 may be made from any electrically conductive material, such as metal.

As shown, multiple slots 204 are arranged in slotting pattern 201 that has evenly aligned rows of slots where each row is staggered or offset from an adjacent row. In this particular embodiment, the spacing between the rows is minimized to maximize the number of slots in a given window area of interconnect portion 200. For example, the spacing between the rows is selected such that non-linear electrical path 206 weaves around the slots across interconnect portion 200. That is, there is not a "linear electrical path" (e.g., "linear metal region") available within the slotting pattern that an electrical current/signal may traverse continuously across interconnect portion 200 (e.g., edge 210a to opposite edge 210b of interconnect portion 200) in the direction of a current flow 209 (e.g., "+" to "−" voltage potentials) without being directly blocked/interfered by a slot along the path.

The slots minimize the degree of dishing that can occur within the vicinity of the slots. That is, rather than having a large dishing effect (e.g., larger height differential between the surfaces of the interconnect and the adjacent dielectric level) across one large region without slots, multiple smaller dishing effects across multiple small regions separated by the slots may instead take place. Therefore, despite being still subjected to the effects of dishing, the uniformity across the interconnects can be maximized and resistances associated with dishing can be minimized. Accordingly, the performance of interconnects along with the semiconductor device incorporating such interconnects can be improved.

Figure 3A:
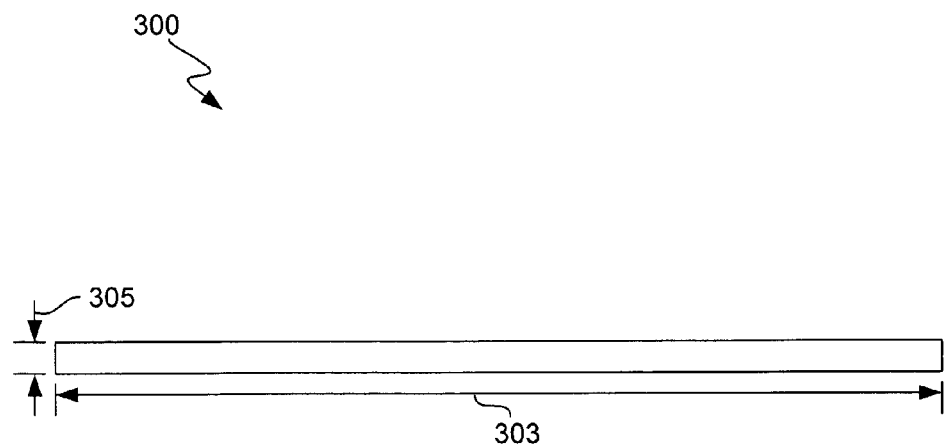
FIG. 3A illustrates a side view of an interconnect portion having an improved slotting pattern.

FIG. 3A illustrates a side view of an interconnect portion 300 having an improved slotting pattern 301. Although interconnection portion 300 may assume any shape and dimension suitable for integrating into a semiconductor device, interconnect portion 300 typically has a substantially rectangular shape with a length 303, a thickness 305, and a width (not shown). Length 303, thickness 305, and width can have any value appropriate for implementing the present invention. For instance, the technology node process or metal used for interconnect portion 300 may determine these values. In one embodiment, interconnect portion 300 has a thickness 305 equal or greater than 100 Angstroms. In another embodiment, thickness 305 ranges from 2200 Angstroms to 2600 Angstroms, such as about 2400 Angstroms.

Figure 3B:
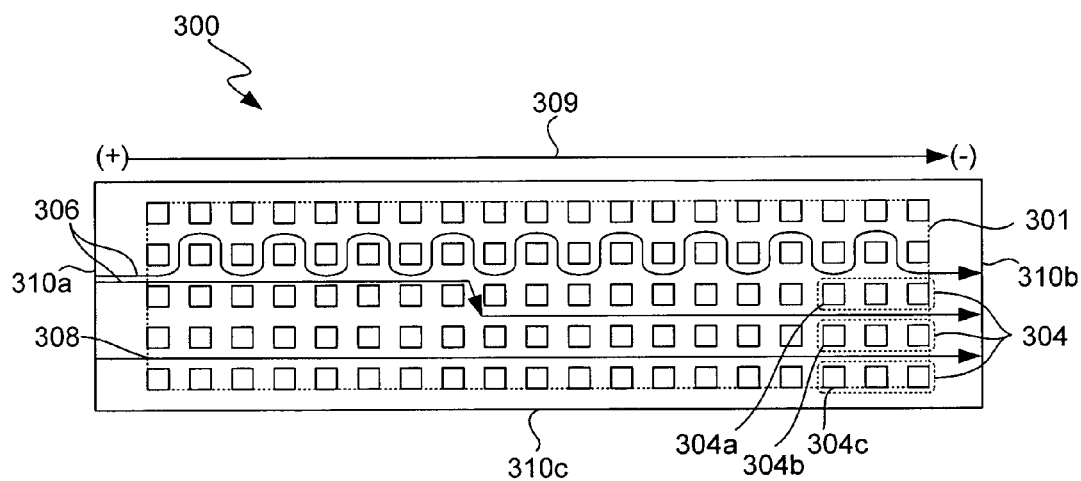
FIG. 3B illustrates a top view of an interconnect portion having an improved slotting pattern.

Next, FIG. 3B illustrates a top view of interconnect portion 300 having improved slotting pattern 301. Typically, multiple slots are evenly distributed within slotting pattern 301. As shown, interconnect portion 300 can be a metal substrate having multiple aligned slots 304 within slotting pattern 301. Each of the aligned slots 304 is separated from each other by a linear electrical path 308 (e.g., linear metal region). In addition, aligned slots 304 may be aligned substantially parallel to linear electrical path 308 and/or an edge 310c on the interconnect portion's periphery and/or an axis (e.g., long or short axis) of the interconnect. In one embodiment, slots of adjacent aligned slots (e.g., slot 304a, 304b, 304c) are aligned substantially perpendicular to linear electrical path 308 (e.g., linear metal region). Typically, linear electrical path 308 is oriented substantially parallel to the overall current flow 309 (e.g., from "+" to "−" voltage potentials). Further as shown in FIG. 3B are non-linear electrical paths 306. For example, non-linear electrical paths 306 may extend at an angle to linear electrical paths 308 across interconnect portion 300 (e.g., edge 310a to edge 310b).

Since linear electrical path 308 is unobstructed by any of the slots in traversing linearly across interconnect portion 300, improved slotting pattern 301 of FIG. 3B provides electrical paths with the shortest distance between edge 310a and 310b in the direction of a current flow 309. As such, time delay can be improved and better performing semiconductor devices can be realized. In addition, a shorter path would reduce resistance of the path.

The slots may assume any shape and dimension applicable for integration into a semiconductor device. For example, each slot may be rectangular in shape and/or be at least 0.5 µm wide by 0.5 µm long. In one embodiment, each slot is about 2.5 µm wide by 2.5 µm long. Typically, slots are openings that penetrate completely through interconnect portion 300. However, it is conceivable to have openings that penetrate only a portion through interconnect portion 300.

In addition to the aforementioned benefits of having slots 304 formed in interconnects to minimize the effects of dishing, physical anchoring of interconnects to dielectric layers is improved. This is because interconnects and dielectric layers are intertwined via the slots. As such, the slots provide an interlocking function. This function may be particularly useful for interconnects acting as power rails/buses since they may tend to move/expand as a result of having higher amounts of heat generated from higher operating currents.

The number and arrangement of slots in a particular area/slotting pattern 301 is typically selected according to design rules. Any design rule may be prescribed. For example, interconnect portion 300 may have a corresponding metal area and slot area where a metal utilization is the ratio of the metal area to the slot area. Therefore, a design rule may include requiring interconnect portion 300 to have its metal utilization fall within a metal utilization range. The design rules may change based on the technology node. In one embodiment for a 90 nm process technology, the metal utilization range is about 0.80 in 100 µm windows. In another embodiment, the metal utilization range is about 0.60 in 500 µm windows. In a preferred embodiment, the metal utilization range is between 0.50 to 0.80. For instance, one metal utilization range is about 0.70.

Figure 4:
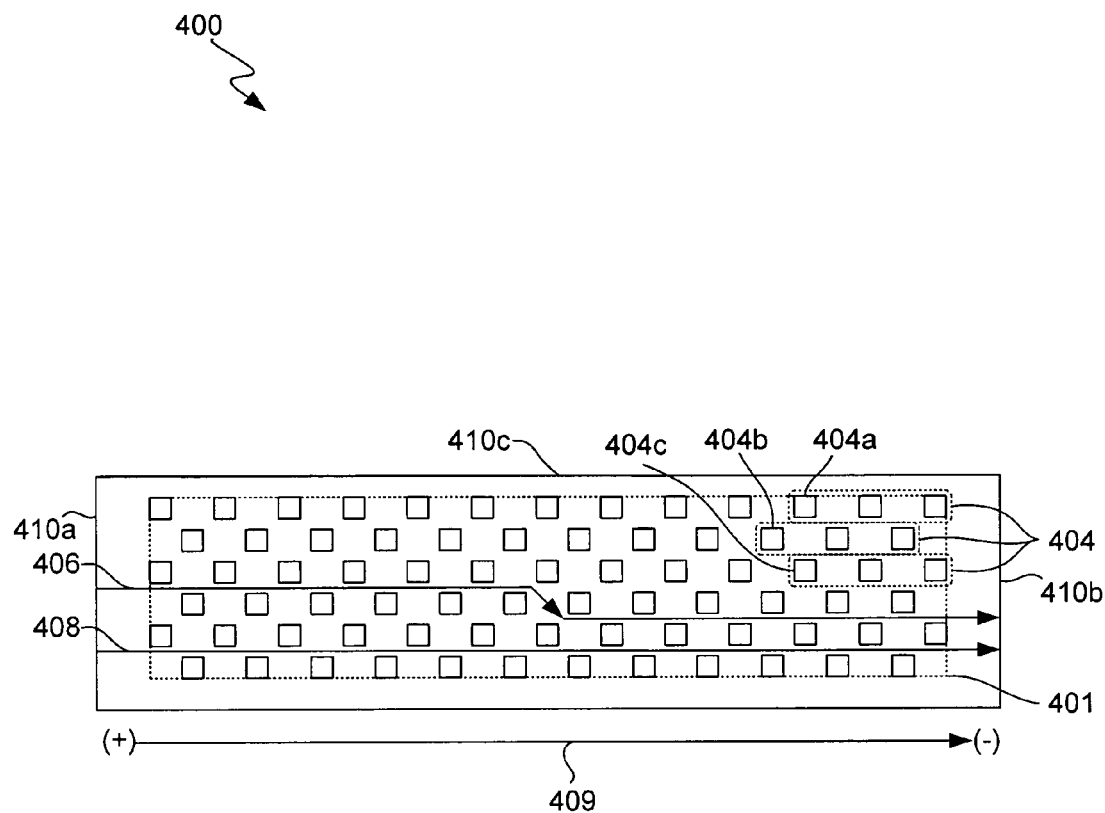
FIG. 4 illustrates a top view of an interconnect portion having another improved slotting pattern.

Next, FIG. 4 illustrates a top view of an interconnect portion 400 having another improved slotting pattern 401. Typically, multiple slots are evenly distributed within slotting pattern 401. Interconnect portion 400 has a plurality of aligned slots 404 arranged such that they are separated by linear electrical paths (e.g., linear metal regions). In addition, aligned slots 404 may be aligned substantially parallel to linear electrical path 408 and/or an edge 410c of interconnect portion 400 and/or an axis (e.g., long or short axis) of interconnect portion 400. In this particular embodiment, slots of adjacent aligned slots are offset from each other. For instance, slots 404a and 404c are offset from slot 404b.

In addition to linear electrical path 408, which traverses linearly across interconnect portion 400 and substantially parallel to current flow 409 (e.g., "+" to "−" voltage potentials), slotting pattern 401 also allows non-linear electrical path 406 to traverse across interconnect portion 400 at an angle to linear electrical path 408. Due to slotting pattern 401, non-linear electrical path 406 has a less acute angled portion as compared to non-linear electrical path 306 shown in FIG. 3B. Such non-linear electrical path 406 may provide a shorter distance (e.g., as compared to non-linear electrical path 306) across opposite edges of an interconnect portion. Therefore, the combination of electrical paths 408 and 406 provide improved performances in reducing time delay.

Although there can be many electrical paths that extend across interconnect portion 400 from one end/edge 410a to an opposite end/edge 410b, the more area allotted to linear electrical paths 408 can reduce the time delay for a current/signal to travel across interconnect portion 400. On the other hand, the number of slots can control the degree of dishing that will occur. Therefore, interconnect portion 400 can be designed to maximize its performance by balancing a number of factors. These factors include, but are not limited to, the size and shape of the slots, the spacing between the slots, the type of conductive material substrate, and the cross sectional area of the interconnect that is available in forming an electrical path. In one embodiment, a linear metal region has a width substantially equal to a slot's width. In another embodiment, a linear metal region's width is of at least 50% of a slot's width.

Any conventional masking technique and/or apparatus may be used to form the interconnects of the present invention. For instance, interconnect portion 400 may be formed using masks known to persons skilled in the art. Generally, the masks can allow the formation of slotting patterns within a metal substrate. According to various embodiments, a mask for forming an interconnect includes a pattern for forming the interconnect with a plurality of aligned slots. In one embodiment, each of the plurality of aligned slots is separated from each other by a linear electrical path and aligned parallel to the linear electrical path and/or an edge on the interconnect's periphery and/or an axis (e.g., long or short axis) of the interconnect.

Figure 5:
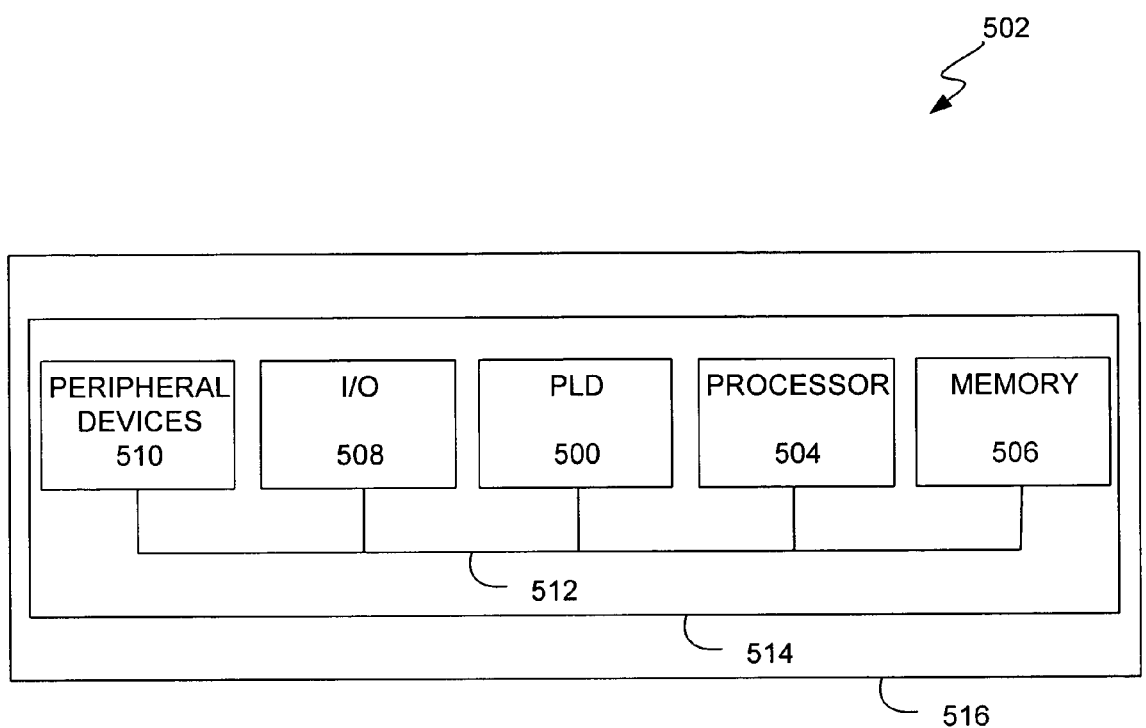
FIG. 5 illustrates one general application of an interconnect in accordance with the present invention as part of a PLD in a data processing system.

FIG. 5 illustrates one general application of interconnects in accordance with the present invention as part of a programmable logic device (PLD) 500 in a data processing system 502. The data processing system 502 may include one or more of the following components: a processor 504; memory 506; I/O circuitry 508; and peripheral devices 510. These components are coupled together by a system bus 512 and are populated on a circuit board 514 that is contained in an end-user system 516.

The system 502 can be used in a wide variety of applications, such as computer networking, data networking, instrumentation, video processing, digital processing, or any other application where the advantage of using reprogrammable logic is desirable. The PLD 500 can be used to perform a variety of different logic functions. For example, PLD 500 can be configured as a processor or controller that works in cooperation with processor 504. The PLD 500 may also be used as an arbiter for arbitrating access to a shared resource in the system 502. In yet another example, PLD 500 can be configured as an interface between the processor 504 and one of the other components in the system 502. It should be noted that the system 502 is only exemplary, and that the true scope and spirit of the invention should be indicated by the following claims.

Thus, in one aspect, the present invention provides a novel structure for electrical interconnects with a slotting pattern that improves performance. In other aspects, the present invention provides masks for making such interconnects and semiconductor devices incorporating such interconnects. Interconnects in accordance with the present invention may be used in PLDs, structured Application-Specific Integrated Circuit (ASIC) devices, or in any other application where minimizing dishing effects, resistances, and/or time delays are sought.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus, comprising:
   a semiconductor device interconnect having:
   a metal substrate having a shorter and a longer axis; and
   a plurality of evenly distributed nonconductive slots penetrating the substrate, the slots arranged in linear alignments substantially parallel with the long axis of the interconnect, wherein the linear alignments of slots are separated by linear metal regions of the metal substrate.

2. The apparatus of claim 1, wherein each linear metal region's width is of at least 50% of a slot's width.

3. The apparatus of claim 1, wherein individual slots of adjacent linear alignments are aligned substantially perpendicular to the linear metal regions.

4. The apparatus of claim 1, wherein individual slots of adjacent linear alignments are offset from each other.

5. The apparatus of claim 3, wherein each slot is rectangular.

6. The apparatus of claim 1, wherein a portion of the semiconductor device interconnect has a metal utilization that is with a metal utilization range, the portion having a corresponding metal area and slot area.

7. The apparatus of claim 6, wherein the metal utilization is the ratio of metal area to slot area.

8. The apparatus of claim 7, wherein the metal utilization range is between 0.50 to 0.80.

9. The apparatus of claim 3, wherein each slot is at least 0.5 μm wide by 0.5 μm long.

10. The apparatus of claim 1, wherein the metal substrate has a thickness equal or greater than 100 Angstroms.

11. A mask for forming a metal interconnect within a semiconductor device, comprising:
    a pattern for forming the metal interconnect having a shorter and a longer axis, the metal interconnect further having a plurality of evenly distributed and penetrating non-conductive slots, the slots arranged in linear alignments substantially parallel with the long axis of the metal interconnect, wherein the linear alignments of slots are separated by linear metal regions of the metal interconnect.

12. The mask of claim 11, wherein each linear metal region's width is of at least 50% of a slot's width.

13. The mask of claim 11, wherein individual slots of adjacent linear alignments are aligned substantially perpendicular to the linear metal regions.

14. The mask of claim 11, wherein individual slots of adjacent aligned linear alignments are offset from each other.

15. The mask of claim 13, wherein each slot is rectangular.

16. The mask of claim 11, wherein a portion of the metal interconnect has a metal utilization that is within a metal utilization range, the portion having a corresponding metal area and slot area.

17. The mask of claim 16, wherein the metal utilization is the ratio of metal area to slot area.

18. The mask of claim 17, wherein the metal utilization range is between 0.50 to 0.80.

19. The mask of claim 13, wherein each slot is at least 0.5 μm wide by 0.5 μm long.

20. The mask of claim 11, wherein the metal interconnect has a thickness equal or greater than 100 Angstroms.

21. A semiconductor device, comprising:
    a metal interconnect having a shorter and a longer axis, the metal interconnect further having a plurality of evenly distributed and penetrating non-conductive slots, the slots arranged in linear alignments substantially parallel with the long axis of the metal interconnect, wherein the linear alignments of slots are separated by linear metal regions of the metal interconnect; and
    a semiconductor substrate having an active device region, the active device region being coupled to the metal interconnect.

22. The semiconductor device of claim 21, wherein each linear metal region's width is of at least 50% of a slot's width.

23. The semiconductor device of claim 21, wherein individual slots of adjacent linear alignments are aligned substantially perpendicular to the linear metal regions.

24. The semiconductor device of claim 21, wherein individual slots of adjacent linear alignments are offset from each other.

25. The semiconductor device of claim 23, wherein each slot is rectangular.

26. The semiconductor device of claim 21, wherein a portion of the metal interconnect has a metal utilization that is with a metal utilization range, the portion having a corresponding metal area and slot area.

27. The semiconductor device of claim 26, wherein the metal utilization is the ratio of metal area to slot area.

28. The semiconductor device of claim 27, wherein the metal utilization range is between 0.50 to 0.80.

29. The semiconductor device of claim 23, wherein each slot is at least 0.5 μm wide by 0.5 μm long.

30. The semiconductor device of claim 21, wherein the metal interconnect has a thickness equal or greater than 100 Angstroms.

31. The semiconductor device of claim 21, wherein the semiconductor device is a programmable logic device.

32. The semiconductor device of claim 21, wherein the semiconductor device is a structured ASIC device.

* * * * *

UNITED STATES PATENT AND TRADEMARK OFFICE
CERTIFICATE OF CORRECTION

| | |
|---|---|
| PATENT NO. | : 7,365,413 B1 |
| APPLICATION NO. | : 10/940511 |
| DATED | : April 29, 2008 |
| INVENTOR(S) | : Yaron Kretchmer et al. |

It is certified that error appears in the above-identified patent and that said Letters Patent is hereby corrected as shown below:

Column 7, line 4, change "nonconductive" to --non-conductive--.

Column 7, line 21, change "is with a" to --is within a--.

Column 8, line 35, change "is with a" to --is within a--.

Signed and Sealed this

Twenty-sixth Day of August, 2008

JON W. DUDAS
*Director of the United States Patent and Trademark Office*